(12) United States Patent
Roche et al.

(10) Patent No.: US 6,190,737 B1
(45) Date of Patent: Feb. 20, 2001

(54) METALIZED ELASTOMERS

(75) Inventors: Thomas Andrew Roche; Anthony Neil Davino, both of Scottsdale, AZ (US); Vinton John Lewis, Birchwood, MN (US)

(73) Assignees: Motorola, Inc., Schaumburg; Summit Coating Technologies, Elmhurst, both of IL (US)

( * ) Notice: Under 35 U.S.C. 154(b), the term of this patent shall be extended for 0 days.

(21) Appl. No.: 09/018,703

(22) Filed: Feb. 4, 1998

(51) Int. Cl.$^7$ ........................................................ B05D 3/02
(52) U.S. Cl. ............................................ 427/386; 427/404
(58) Field of Search ................................... 427/250, 123, 427/306, 305, 385.5, 404, 386

(56) References Cited

U.S. PATENT DOCUMENTS

| | | |
|---|---|---|
| 2,993,806 | 7/1961 | Fisher . |
| 3,267,007 | 8/1966 | Sloan . |
| 3,914,472 | 10/1975 | Nakanishi . |
| 4,112,190 | 9/1978 | Sato et al. . |
| 4,216,246 | 8/1980 | Iwasaki . |
| 4,402,998 | 9/1983 | Kumagai . |
| 4,444,848 | 4/1984 | Shanefield . |
| 4,650,723 | 3/1987 | Furuya . |
| 4,869,930 | 9/1989 | Clarke . |
| 4,897,118 | * 1/1990 | Ferrier et al. ........................ 106/1.11 |
| 5,273,816 | 12/1993 | Olson . |
| 5,317,195 | 5/1994 | Ishikawa . |

FOREIGN PATENT DOCUMENTS

135674 * 9/1993 (EP) .

* cited by examiner

Primary Examiner—Brian K. Talbot
(74) Attorney, Agent, or Firm—Bryan Cave LLP

(57) ABSTRACT

A method (10) for coating a substrate including at least an elastomer substrate portion with a conductive coating is described. The method includes steps of (i) providing a substrate comprising elastomer material and (ii) coating (13) the substrate with an adhesion promoting layer. The layer comprises a thin layer of B stage heat curable epoxy. The method also includes steps of (iii) pre-curing (15) the adhesion-promoting layer, (iv) disposing (17) a conductive coating atop the layer and (v) post-curing (19) the adhesion-promoting layer.

45 Claims, 3 Drawing Sheets

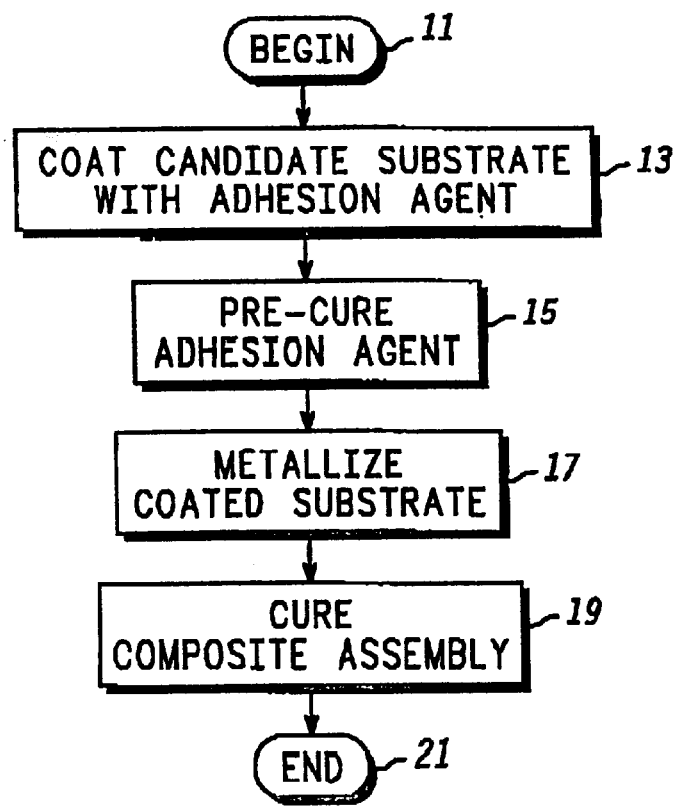
FIG. 1
FIG. 2
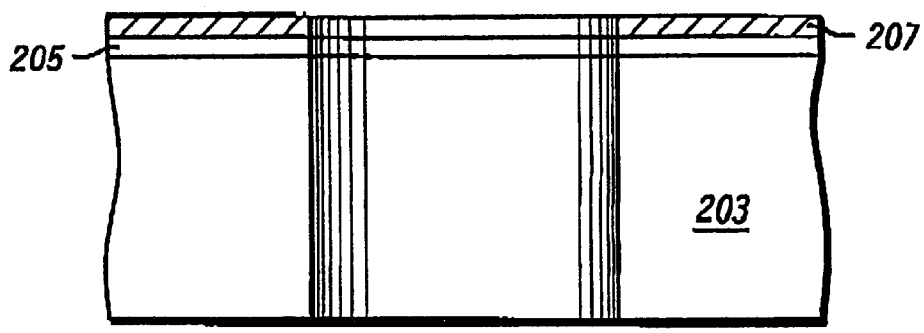

METALIZED ELASTOMERS

FIELD OF THE INVENTION

This invention relates to deposition of metal conductive layers on substrate materials, in general, and to metallization of flexible materials as well as metallization of substrates including both flexible and rigid portions, in particular.

BACKGROUND OF THE INVENTION

Conductive elastomer materials are used to form gaskets for sealing electronic modules which are typically enclosed in a rigid enclosure. The gaskets provide physical integrity by preventing unwanted materials from entering the enclosure. The gaskets are also provided to further radio frequency (rf) signal shielding to prevent unwanted emission of signals from within the module and to prevent unwanted reception of radio frequency signals from entering the module. Where rf shielding is of concern, it is highly desirable that the gasket be electrically conductive. To provide a good physical seal, the gasket is desirably of a flexible material such as an elastomer.

Conductivity has been imparted to elastomer materials by mixing finely divided conductive particles, usually metallic, with the materials that are cast to provide the conductive elastomer. The mixture is typically cast as a sheet from which gasket shapes are then cut. There are disadvantages associated with such conductive elastomer gaskets, including poor conductivity and poor thermal cycling behavior. The poor conductivity occurs as a result of several factors, including the fact that inter-particle contact is required for the material as a whole to be conductive and achieving such inter-particle contact over the continuum of the gasket is difficult to achieve. Additionally the conductive particle loading of the elastomer material may be inadequate either overall or in localized areas. Also, such gaskets may likewise have relatively poor thermal cycling behavior of the conductivity because the particles may not stay in continuous conductive contact as the material is heated and cooled.

Poor or variable (e.g., with thermal cycling) conductivity results in sporadic and/or inadequate electronic shielding of the equipment using such conductive elastomer material for rf gaskets. This may lead to failure to meet specifications and/or inappropriate electrical performance.

Various methods have been attempted in the past to deposit metal layers on non-metallic and insulating substrates, however, none of the prior approaches have produced conductive layers on flexible materials which retain adherence to the flexible material and continuity after flexing of the material.

BRIEF DESCRIPTION OF THE DRAWING

The invention will be better understood from a reading of the following detailed description taken in conjunction with the drawing figures in which like reference designators are used to designate like elements, and in which:

FIG. 1 is a flow chart of a process for metallization of a substrate comprising an elastomer material in accordance with the present invention;

FIG. 2 is an elastomer gasket in accordance with the principles of the invention;

DETAILED DESCRIPTION

Figure 3:
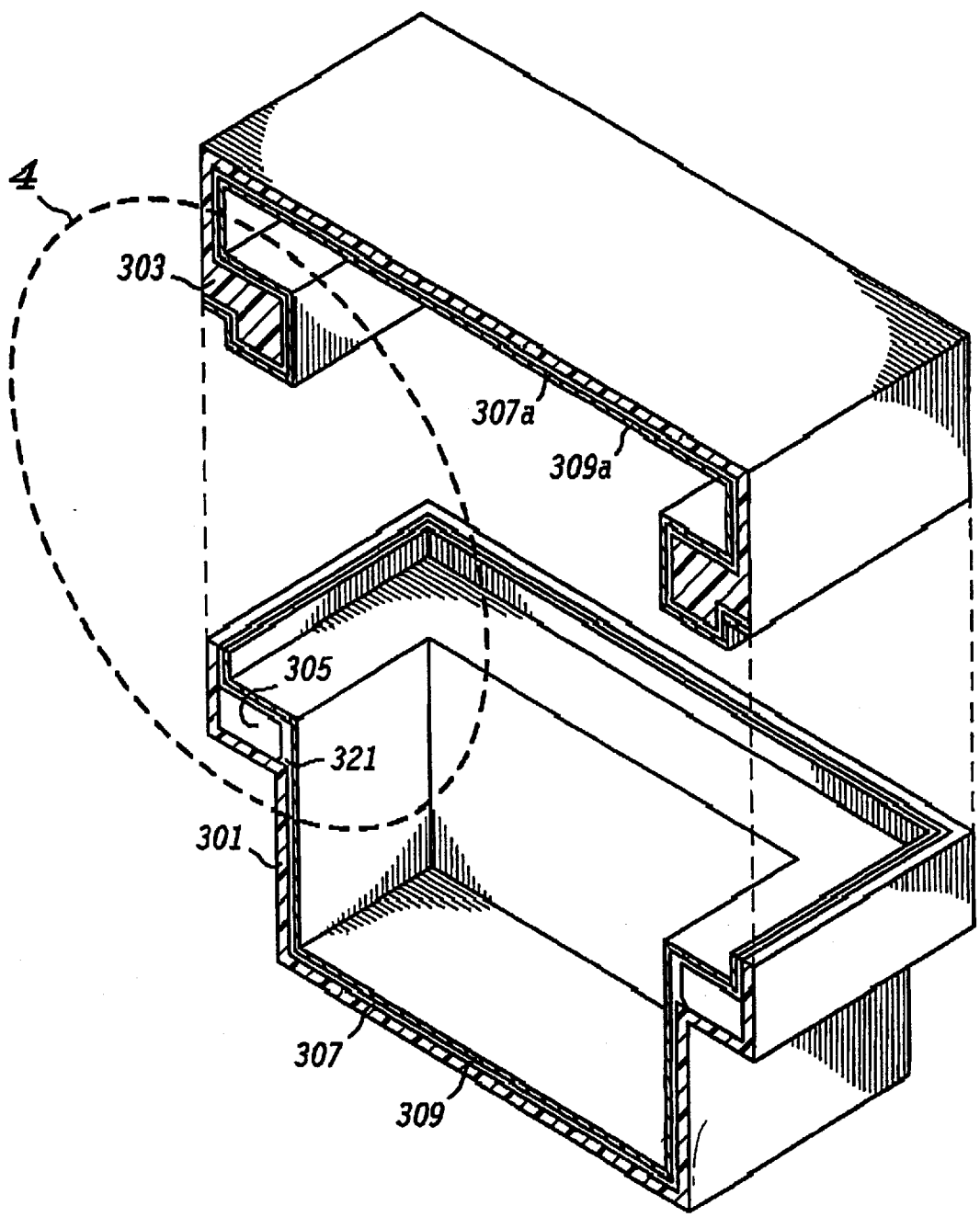
FIG. 3 illustrates an assembly in accordance with the principles of the invention.

Turning now to FIG. 1, a process 10 for metallization of a substrate comprising an elastomer material is described in accordance with the present invention. In the illustrative embodiment, the elastomer material is a vulcanized ethylene propylene diene monomer (EPDM/PP). The process 10 may be utilized to form a conductive metal coating on a substrate such as the elastomer gasket shown in FIG. 2 or on a composite substrate such as the one shown in FIG. 3. Process 10 begins with the selection 11 of a substrate to be processed in accordance with the invention. An example of a preferred substrate material is a thermoplastic elastomer (TPE) identified as Santoprene® and which is available from Advanced Elastomers of Akron, Ohio. The substrate is coated in step 13 with an adhesion agent. In a preferred embodiment, the selected substrate is coated with B-stage epoxy material. The B-stage epoxy material is 3M's 2290, diluted 1:4 with a dilutent comprising four parts methyl ethyl ketone and one part tetrahydrofuran. With this material, coating in a range of about one to ten microns thickness is possible by either spray or dip coating. Films having a thickness of less than about a micron tend to lack the strength for subsequent processing steps.

After coating the substrate with an adhesion agent, the substrate is subjected to a first curing or pre-curing step 15. Pre-curing is usually carried out by heating the coated substrate to a temperature of 65° C. to 140° C. and could go to as high as 170° C., provided that the substrate can accommodate this temperature, for a period of time ranging from two to three minutes (at the upper end of the temperature range) to half of an hour (at the lower end of the temperature range) until the adhesion coating elasticity matches that of the substrate material. One useful test for determining adequacy of the pre-curing treatment is to fold the elastomer material double over itself so that there is no radius; if the adhesion coating splits or delaminates, further baking is needed. Pre-cure baking may be carried out by transporting the coated articles on a conveyor under an infrared heater. This method lends itself to higher temperatures, shorter cure times and high throughout.

The pre-curing stage has several purposes: (i) to reduce liquefaction and especially flowing of the epoxy film during metallization deposition and (ii) to reduce crazing of the film during post-deposition curing.

Metallization 17 follows the pre-curing step 15. Metallization may be carried out via several metallization processes, i.e., electroless plating, vacuum evaporation, sputtering and the like, however, vacuum deposition is preferred. Vacuum deposition has the advantage of not requiring disposal of environmentally hazardous materials encountered with some electroless and/or electroplating processes. Metallization desirably includes a depositing a nickel flash layer 16 (i.e., a thin coating having a thickness of less than one micron and preferably less than one-tenth micron) followed by the full metallization step 17 of depositing a coating of copper up to approximately five microns in thickness, but preferably 0.5 to 1.0 micron thick. The metallization step 17 is carried out in any readily available rf sputter coating apparatus. Typically, the substrate and epoxy film will be heated to at least 70° C. and possibly higher by the metal. It is desirable to pre-cure the epoxy film at the highest temperature likely to be encountered in the deposition process.

Vacuum evaporation of aluminum is preferred for coating of the substrate for several reasons: (i) aluminum thin films have surprisingly high conductivity, compared to other materials; (ii) aluminum has a relatively high thermal coefficient of expansion, allowing matching of thermal properties to a wide range of substrate materials and (iii) aluminum films are surprisingly strong compared to what would be expected from the properties of bulk aluminum. The films so deposited are less than 10 microns thick and are typically in the range of 0.5 to 1.0 microns.

Following the metallization step 17, a curing step 19 of the composite assembly is carried out. The curing step 19 is typically carried out at a temperature of 65° C. to 140° C. for a time of between several and twelve hours, with times of ten to eleven hours at about 75° C. being common. The curing temperature is usually close to the pre-curing temperature although this is not necessary. The objective of the curing stage is to fully react the epoxy without incurring crazing or delamination of the deposited metal film. Following the curing step 19, the process of metallization of the substrate is complete as indicated at end step 21.

Applicants have successfully deposited films of stainless steel, copper, nickel copper, aluminum and even silver on B-stage epoxy films. The substrate material is selected to withstand pre-curing of the adhesion agent 15, metallization 17 of the coated substrate and curing 19 of the composite assembly, following which process 10 ends. Additionally, the substrate must be able to meet the requirements of the end use to which the article is to be put (i.e., temperature range of operation, elasticity etc.).

Substrates on which this process has been successfully employed include polycarbonates, different blends of ABS, Santoprene and urethanes. In addition, the method has been successfully applied to metallization of crystalline substrates such as ceramic substrates. Substrates on which this process has not shown success include fluorocarbons, materials having mold release agents therein and inhomogeneous quick molds, which later tend to ooze unreacted materials when heated, floating off the epoxy films.

Turning now to FIG. 2 a gasket 201 shown in cross-section and processed in accordance with the invention is shown. The gasket 201 includes a substrate 203 of Santoprene elastomeric material. Substrate 203 includes a peripheral portion 209 which surrounds an opening 211. The substrate includes a layer 205 of adhesion agent in the range of five to ten microns thick. A metallization layer 207 is provided upon layer 205. The gasket 201 may have any number of shapes and may be used for to provide a radio frequency shielding gasket. Although not shown in the drawing, a thin metallization flash coating of nickel may be deposited intermediate the adhesion layer 205 and the metallization layer 207. The shape of gasket 201 is intended to demonstrate a general gasket or flexible seal and is not intended to in any way limit the invention. The gasket or seal may take any shape which is desirable to provide a gasket or seal for specific applications. The seal or gasket is illustratively formed of a flexible material and the adhesion agent is a B-stage epoxy film as described above. The gasket or seal 201 is processed in accordance with the process described above with reference to FIG. 1. The gasket or seal 201 may also be metallized on additional surfaces using the process of FIG. 1. Portions of the gasket may be masked off during the metallization process if is desired to metallize a pattern on gasket 201. Gasket 201 may be used in various shapes to provide a seal for an electronic assembly.

Figure 4:
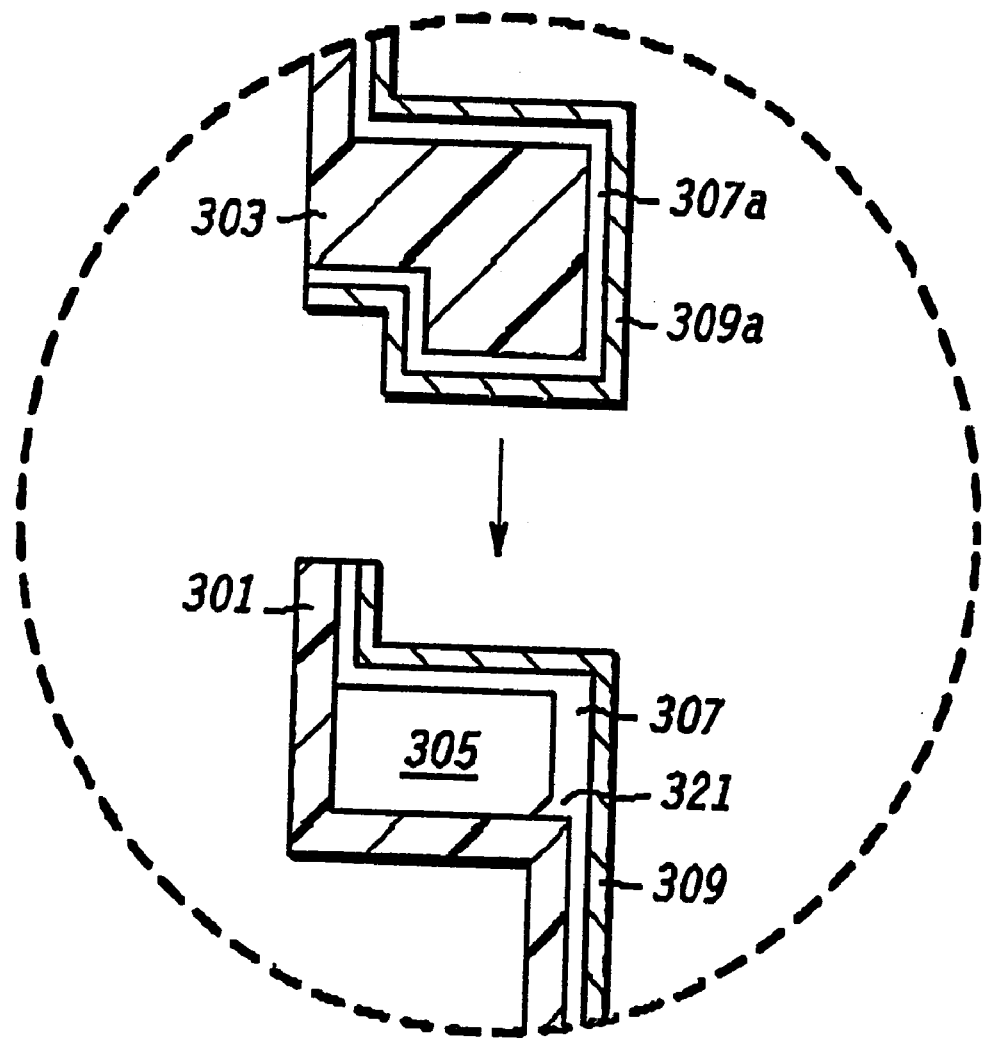
FIG. 4 illustrates a portion of the assembly of FIG. 3 in greater detail.

Turning now to FIGS. 3 and 4, an assembly is shown to which the invention is advantageously applied. The assembly includes a housing portion 301 for electronic equipment which mates to a second housing portion 303. The assembly shown in the FIGS. 3 and 4 is a cellular telephone housing shown in cross-section. The housing includes a front or top portion 300 and a bottom or back portion 303. The housing portion 301 carries an elastomeric gasket 305 comprising an elastomeric substrate 304, an adhesive agent 307 and a metallization layer 309. The gasket 305 is carried on housing portion 301 in a gasket or seal receiving portion 311 which is in the form of a receiving channel into which the gasket 305 is carried prior to assembly of the housing. Housing portion 301 and gasket 305 are treated as a two part or composite substrate which is processed in accordance with the principles of the invention. Housing 301 and substrate 304 are both coated with an adhesion agent layer 307. The adhesion layer 307 is disposed principally on the interior of housing 301 and on the substrate 304. In practice, the substrate 304 is disposed into the seal receiving portion 311 prior to coating the housing portion 301 with the adhesion layer 307. Advantageously, assembly is simplified since the substrate 304 may be processed concurrent with the processing of the housing 301 to provide a metallization layer. A metallization layer 309 five to ten microns thick is deposited upon the adhesion layer 307. Similarly, an adhesion layer 307a is deposited on the interior surface of housing portion 303. A metallization layer 309a is deposited on adhesion layer 307a. Advantageously, by processing the composite substrate formed by the housing portion 301 and gasket 305 in accordance with the process of the invention, a structure is provided in which the metallization layer 309 bridges the gap between the solid portion 303 of the substrate and the elastomeric substrate 304 at the interior of the housing 301. The resulting gasket 305 is flexible so that it will conform to the shape of the edge of housing portion 303. This permits a continuous contact to be established and maintained between the metallization layer 309a of housing portion 303 and metallization layer 309 disposed on housing portion 301 and on gasket 305. A continuous seal is thereby obtained between metallization layer 309 and metallization layer 309a This structure has the advantage that improved high frequency radio frequency shielding is provided. By providing the mating housing portion 303 with a metallization layer 309, a substantially continuous metallization layer is provided for the two piece housing thereby providing an electronic unit having a continuous rf shield. One significant advantage to a structure formed in accordance with the invention is that galvanic action between the gasket and the housing is eliminated because both the gasket and the housing have the same metallization layer rather than dissimilar metals. As will be appreciated by those skilled in the art, the housing could also include more than two pieces and each piece could carry or mate to a gasket carried on another piece. Thus a multiple piece housing can be provided in which a continuous metallization layer is provided to thereby provide a continuous rf shield. By utilizing thin metallization layers, the quality of the unit is increased because the thin layer in combination with the adhesion layer permits the gasket to be flexible.

Thus, elastomeric substrates and composite substrates are provided having a continuous conductive coating. The conductive coating materials has been described which overcomes specific problems and provides certain advantages relative to prior art conductive substrates. The improvements over known technology are significant. Problems with poor particle loading and poor thermal stability noted with prior art conductive gaskets are obviated by employing a gasket in accordance with the invention. Additionally, the ability to use various top-coat metallization systems allows galvanic matching of the gasket to the housing. Reliable and robust rf gasket performance is realized by the method of the present invention. Further, a continuous and flexible metallic film is firmly bonded to the elastomeric material. Finally, a myriad of off-the-shelf molded gasket materials may be coated, rather than attempting to cut gaskets to shape from sheets of elastomeric materials loaded with conductive particles, which has been the practice prior to the present invention.

It is to be understood that the phraseology or terminology employed herein is for the purpose of description and not of limitation. Accordingly, the invention is intended to embrace all such alternatives, modifications, equivalents and variations as fall within the spirit and broad scope of the appended claims.

Although the invention has been described in terms of the illustrative embodiment, it will be appreciated by those skilled in the art that various changes and modifications may be made to the illustrative embodiment without departing from the spirit or scope of the invention. It is intended that the scope of the invention not be limited in any way to the illustrative embodiment shown and described but that the invention be limited only by the claims appended hereto.

What is claimed is:

1. A method for coating an elastomer substrate with a conductive coating, said method comprising steps of:
   providing a substrate comprising an elastomer material;
   coating said substrate with an adhesion-promoting layer comprising B stage epoxy;
   disposing said conductive coating atop said adhesion-promoting layer;
   pre-curing said adhesion-promoting layer prior to said disposing step; and
   post-curing said adhesion-promoting layer after said disposing step.

2. A method in accordance with claim 1, wherein:
   said coating step comprises coating said substrate with a layer consisting of B-stage epoxy diluted with a mixture of four volumes of methyl ethyl ketone and one volume of tetrahydrofuran.

3. A method in accordance with claim 1, wherein:
   said coating step comprises coating said adhesion-promoting layer to a thickness of about five to ten microns.

4. A method in accordance with claim 1, wherein:
   said coating step comprises coating the adhesion-promoting layer to a thickness of about one to ten microns.

5. A method in accordance with claim 1, wherein:
   said pre-curing step comprises baking said substrate and adhesion-promoting layer at a temperature between approximately 65° C. to 140° C.

6. A method in accordance with claim 1, wherein:
   said pre-curing step comprises baking said substrate at a temperature of approximately 75° C.

7. A method in accordance with claim 1, wherein:
   said disposing step comprises vacuum deposition of a conductive film.

8. A method in accordance with claim 7, wherein:
   said disposing step comprises vacuum evaporation of aluminum to provide a conductive aluminum film on said adhesion promoting layer.

9. A method for coating an elastomer substrate with a conductive film, said method comprising steps of:
   providing a substrate comprising an elastomer material;
   coating said substrate with an adhesion-promoting layer, said adhesion-promoting layer comprising a thin layer of heat curable epoxy;
   pre-curing said adhesion-promoting layer;
   disposing said conductive film less than 5 microns thick atop said adhesion-promoting layer; and
   post-curing said adhesion-promoting layer.

10. A method in accordance with claim 9, wherein:
    said adhesion-promoting layer is up to ten microns thick.

11. A method in accordance with claim 9, wherein:
    said heat curable epoxy comprises B-stage epoxy diluted with a mixture of methyl ethyl ketone and tetrahydrofuran.

12. A method in accordance with claim 9, wherein:
    said pre-curing step comprises baking said substrate and adhesion-promoting layer at a temperature of approximately 65° C. to 140° C.

13. A method in accordance with claim 9, wherein:
    said post-curing step comprises baking said substrate at a temperature of approximately 75° C.

14. A method in accordance with claim 12, wherein:
    said post-curing step comprises baking said substrate at a temperature of approximately 75° C.

15. A method in accordance with claim 9, wherein:
    said disposing step comprising vacuum deposition of a conductive film.

16. A method in accordance with claim 9, wherein:
    said disposing step comprises vacuum evaporation of aluminum to provide said conductive film on said adhesion promoting layer.

17. A method for coating a substrate, comprising:
    providing a substrate comprising at least one material selected from the group consisting of an elastomer material, a plastic material, and a crystalline material;
    coating at least selected portions of said substrate with an adhesion-promoting layer;
    depositing a metal coating on said adhesion-promoting layer;
    pre-curing said adhesion-promoting layer before said depositing step; and
    post-curing said adhesion-promoting layer after said depositing step.

18. A method in accordance with claim 17, comprising:
    providing a flash coating of a first metal intermediate said adhesion-promoting layer and said metal coating.

19. A method in accordance with claim 18, wherein:
    said flash coating comprises nickel.

20. A method in accordance with claim 19, wherein:
    said metal coating comprises copper.

21. A method in accordance with claim 19, wherein:
    said metal coating comprises a metal selected from the group consisting of stainless steel, copper, nickel-copper, aluminum and silver.

22. A method in accordance with claim 17, wherein:
    said metal coating comprises a metal selected from the group consisting of stainless steel, copper, nickel-copper, aluminum and silver.

23. A method in accordance with claim 18, wherein:
    said metal coating comprises a metal selected from the group consisting of stainless steel, copper, nickel, nickel-copper, aluminum and silver.

24. A method in accordance with claim 23, wherein:
    said adhesion promoting layer comprises a B-stage epoxy material.

25. A method in accordance with claim 24, wherein:
said B-stage epoxy material is diluted with a mixture of four volumes of methyl ethyl ketone and one volume of tetrahydrofuran.

26. A method in accordance with claim 23, wherein:
said substrate comprises a composite substrate comprising said at least one material and a second material selected from said elastomer material, said plastic material and said crystalline material.

27. A method in accordance with claim 23, wherein:
said substrate comprises said elastomer material.

28. A method in accordance with claim 27, wherein:
said metal coating consists of aluminum, and said metal coating is flexible.

29. A method in accordance with claim 23, wherein:
said depositing step comprises vacuum deposition of said metal coating.

30. A method in accordance with claim 23, wherein:
said depositing step comprises vacuum evaporation of said metal.

31. A method in accordance with claim 30, wherein:
said metal consists of aluminum.

32. A method in accordance with claim 17, wherein:
said adhesion-promoting layer comprises a thin layer of heat curable epoxy.

33. A method in accordance with claim 32, wherein:
said thin layer is approximately five to ten microns thick.

34. A method in accordance with claim 17, wherein:
said coating step comprises providing a B-stage epoxy diluted with four volumes of methyl ethyl ketone and one volume of tetrahydrofuran for the adhesion-promotinq layer.

35. A method in accordance with claim 17, wherein:
said pre-curing step comprises baking said substrate and adhesion-promoting layer at a temperature of approximately 65° C. to 140° C.

36. A method in accordance with claim 35, wherein:
said post-curing step comprises baking said substrate at a temperature of approximately 75° C.

37. A method in accordance with claim 17, wherein:
said post-curing step comprises baking said substrate at a temperature of approximately 75° C.

38. A method in accordance with claim 17, wherein:
said depositing step comprises a vacuum deposition of said metal coating.

39. A method in accordance with claim 17, wherein:
said depositing step comprises vacuum evaporation aluminum.

40. A method in accordance with claim 17, wherein:
said substrate comprises said elastomer material attached to said plastic or crystalline material.

41. A method for producing a gasket comprising the steps of:
providing a substrate comprising an elastomer body;
coating said substrate on at least a surface portion of said body with an adhesion-promoting layer comprising B stage epoxy;
disposing a conductive coating atop said adhesion-promoting layer;
curing said adhesion-promoting layer before disposing said conductive coating; and
curing said adhesion-promoting layer after disposing said conductive coating.

42. A method in accordance with claim 17, wherein:
coating the at least selected portions of the substrate comprises:
providing a diluted B stage epoxy for the adhesion-promoting layer;
depositing the metal coating comprises:
vacuum depositing the metal coating; and
post-curing the adhesion-promoting layer comprises:
curing the adhesion-promoting layer to an elasticity compatible with an elasticity of the substrate.

43. A method in accordance with claim 42, wherein:
the adhesion-promoting layer has a thickness between approximately five and ten microns.

44. A method in accordance with claim 43, wherein:
the diluted B stage epoxy is comprised of a B stage epoxy diluted by four parts of a diluent to one part of the B stage epoxy.

45. A method in accordance with claim 44, wherein:
depositing the metal coating comprises:
providing the metal coating to be comprised of aluminum;
pre-curing the adhesion-promoting layer comprises:
pre-curing the adhesion-promoting layer at a temperature between approximately 65° C. and 140° C.; and
post-curing the adhesion-promoting layer comprises:
post-curing the adhesion-promoting layer at a temperature between approximately 65° C. and 140° C.

* * * * *